United States Patent [19]

Kezuka et al.

[11] Patent Number: 5,763,375
[45] Date of Patent: Jun. 9, 1998

[54] CLEANING AGENTS AND CLEANING METHOD

[75] Inventors: Takehiko Kezuka; Mitsushi Itano; Motonobu Kubo, all of Settsu, Japan

[73] Assignee: Daikin Industries, Ltd., Osaka, Japan

[21] Appl. No.: 682,590

[22] PCT Filed: Jan. 25, 1995

[86] PCT No.: PCT/JP95/00086

§ 371 Date: Jul. 24, 1996

§ 102(e) Date: Jul. 24, 1996

[87] PCT Pub. No.: WO95/20642

PCT Pub. Date: Aug. 3, 1995

[30] Foreign Application Priority Data

Jan. 26, 1994 [JP] Japan ............... 6-024850

[51] Int. Cl.⁶ .................. C11D 7/08; C11D 7/28; C11D 7/32; H01L 21/304
[52] U.S. Cl. .................. 510/175; 510/176; 510/204; 510/206; 510/209
[58] Field of Search ............... 510/175, 204, 510/206, 209, 176

[56] References Cited

U.S. PATENT DOCUMENTS

| | | | |
|---|---|---|---|
| 3,715,250 | 2/1973 | Altman et al. | 156/22 |
| 4,140,709 | 2/1979 | Szur | 260/458 F |
| 4,269,739 | 5/1981 | Grejsner | 252/547 |
| 4,302,348 | 11/1981 | Requejo | 252/135 |
| 4,752,505 | 6/1988 | Arac | 427/88 |
| 5,169,680 | 12/1992 | Ting et al. | 427/96 |
| 5,277,835 | 1/1994 | Ohmi et al. | 252/79.4 |
| 5,580,846 | 12/1996 | Hayashida et al. | 510/175 |
| 5,635,463 | 6/1997 | Muraoka | 510/175 |

FOREIGN PATENT DOCUMENTS 133584  2/1985  European Pat. Off.  ......... C23F 1/10

OTHER PUBLICATIONS

Ohmi et al., J. Electrochem. Soc., vol. 140, No. 3, Mar. 1993, pp. 811–818.

*Primary Examiner*—Johann Richter
*Assistant Examiner*—Sabiha N. Qazi
*Attorney, Agent, or Firm*—Kubovcik & Kubovcik

[57] ABSTRACT

A cleaning agent characterized in that the agent comprises 0.1 to 4 wt. % of hydrofluoric acid, a surfactant of the following formula (1) in a concentration of 50 to 1500 ppm or a surfactant of the following formula (2) or (3) in a concentration of 50 to 100000 ppm, and the balance water, and a cleaning method of the surfaces of silicon wafers and the like using the agent $$RfCOONH_4 \tag{1}$$

wherein Rf is a fluorine-containing hydrocarbon group having 5 to 9 carbon atoms $$Rf'O(CH_2CH_2O)nR \tag{2}$$

$$Rf'(CH_2CH_2O)nR \tag{3}$$

wherein Rf' is a fluorine-containing hydrocarbon group having 5 to 15 carbon atoms, R is hydrogen or alkyl having 1 to 4 carbon atoms, and n is 5 to 20.

16 Claims, No Drawings

CLEANING AGENTS AND CLEANING METHOD

TECHNICAL FIELD

The present invention relates to cleaning agents and a cleaning method, for example, for use in processes for producing semiconductor devices for cleaning the surfaces of semiconductor substrates such as silicon wafers. More particularly, the invention relates to cleaning agents and a cleaning method which are highly effective for preventing the contamination of the surfaces of silicon wafers and the like with fine particles. Further more particularly, the invention relates to cleaning agents and a cleaning method for removing a native oxide film, usually about 10 angstroms in thickness, from the surfaces of silicon wafers and the like, and for preventing the contamination of cleaning solutions due to the presence of fine particles therein.

BACKGROUND ART

In processes for producing semiconductor integrated circuit devices wherein LSIs are formed on semiconductor substrates (wafer) comprising a single crystal of silicon, a wet cleaning treatment is conducted with use of various chemical solutions to remove organic substances, metal or like fine particles and a native oxide film from the substrate surfaces. Generally used as chemical solutions for the wet cleaning treatment are, for example, those comprising a sulfuric acid ($H_2SO_4$)—hydrogen peroxide ($H_2O_2$) aqueous solution, hydrochloric acid (HCl)—hydrogen peroxide ($H_2O_2$) aqueous solution or hydrofluoric acid (HF)—hydrogen peroxide ($H_2O_2$) aqueous solution, hydrofluoric acid (HF)—nitric acid ($HNO_3$)—acetic acid ($CH_3COOH$) aqueous solution, ammonia ($NH_4OH$)—hydrogen peroxide ($H_2O_2$) aqueous solution, or aqueous solution of hydrofluoric acid. However, particles are very prone to adhere to the substrate surface after the native oxide film is removed by the wet cleaning treatment especially when solutions of hydrofluoric acid or a mixture containing the acid is used. The particles adhering to the substrate surface cause short-circuiting of the wiring or other fault, directly impairing the yield of semiconductor integrated circuit devices as products, so that the number of adhering particles must be minimized. The adhesion of particles to the substrate surface is conventionally prevented, for example, by circulating the cleaning solution through a membrane filter having a pore size of about 0.1 micrometer and thereby minimizing the number of particles present in the solution.

With integrated circuits made available with a finer pattern, the cleaning solution is required to have higher cleanliness, whereas the number of extraneous particles brought into the cleaning bath tends to rather increase owing to an increase in the number of wafer processing steps or in the diameter of wafers.

In view of the situation described, JP-A-53083/1991, for example, discloses a method of preventing metallic contamination of semiconductor devices which is characterized by adding an anionic surfactant of short molecular length with 5 to 8 carbon atoms to an aqueous solution of hydrofluoric acid or the like. However, the surfactants mentioned for use in this method are only carboxylic acids or sulfonic acids represented by $C_xH_yCOOH$, $C_xH_ySO_3H$, $C_xF_yCOOH$ or $C_xF_ySO_3H$ (wherein x is an integer of 4 to 7, and y is an integer of 9 to 15), or salts thereof, and the publication contains no further description in greater detail and mentions nothing about the salts. Merely listed in Table 2 of the publication are carboxylic acids or sulfonic acids with 5 to 7 carbon atoms as the acids used in the examples. Although no generalized description is given as to the concentration of hydrofluoric acid and the like for use in the method, an acid of considerably high concentration, such as 6% HF or 5% HF, is used in the examples.

JP-A-138142/1993 describes a technique concerning a method of controlling adhesion of fine particles in a solution which method is characterized in that a substance capable of controlling the zeta potential (surface potential) of the fine particles is added to the solution at a concentration in the range of $10^{-7}$ to 25 vol. % to thereby prevent or diminish the adhesion of fine particles which are present in the solution as the particles to be adsorbed, thus showing a cleaning method for preventing or reducing the adhesion of fine particles to the surfaces of semiconductor wafers or the like.

The term "substance capable of controlling the zeta potential," however, is a very ambiguous expression indicating, for example, a substance having a hydrophilic group and hydrophobic group in the molecule. Mentioned as examples of such substances in the fifth column are alcohol, glycol, amine, amide, amino alcohol, aldehyde, organic acid, ester, ketone and nonionic surfactant, etc. A fluorine-containing carboxylic acid only is mentioned in Example 3, but nothing is described about the addition of the acid to hydrofluoric acid (which may be referred to as "HF" hereinafter).

JP-A-67601/1993 also discloses a technique which closely resembles that of JP-A-138142 and is almost the same as the latter except that the adhesion of fine particles in the latter is expressed as the adhesion of extraneous material, and exactly the same as the latter with respect to the substance capable of controlling the zeta potential thereof.

An object of the present invention is to provide an agent for cleaning the surfaces of silicon wafers and the like wherein a surfactant of specific structure which surfactant has not been clearly recognized in the prior art is used in a specified composition so as to exhibit a remarkable effect in preventing the adhesion of fine particles, and a cleaning method.

DISCLOSURE OF THE INVENTION

The present invention provides a cleaning agent characterized in that the agent comprises 0.1 to 4 wt. % of hydrofluoric acid, a surfactant of the following formula (1) in a concentration of 50 to 1500 ppm or a surfactant of the following formula (2) or (3) in a concentration of 50 to 100000 ppm, and the balance water, and a cleaning method using the agent

RfCOONH₄ (1)

wherein Rf is a fluorine-containing hydrocarbon group having 5 to 9 carbon atoms

RfO(CH₂CH₂O)nR (2)

Rf(CH₂CH₂O)nR (3)

wherein Rf is a fluorine-containing hydrocarbon group having 5 to 15 carbon atoms, R is hydrogen or alkyl having 1 to 4 carbon atoms, and n is 5 to 20.

The invention further provides a cleaning agent characterized in that the agent comprises at least one compound selected from the group consisting of hydrogen peroxide, hydrochloric acid, nitric acid, acetic acid, sulfuric acid and phosphoric acid in addition to, or in place of, hydrofluoric acid, and a cleaning method using the agent.

The surfactants specified above and the cleaning agent of the specified composition containing the surfactant for use in the invention are not disclosed specifically in JP-A-53083/1991, JP-A-138142/1993 or JP-A-67601/1993 mentioned above. Moreover, unlike the surfactants of the free carboxylic acid type disclosed in these publications, the surfactants of the invention having the specific structure exhibit an outstanding effect to prevent the adhesion of fine particles when used in the specified composition.

Examples of surfactants of the formula (1) for use in the present invention are compounds represented by $$C_xF_{2x+1}(CH_2)_yCOONH_4$$

$$C_xF_{2x-1}(CH_2)_yCOONH_4$$

$$HC_xF_{2x}(CH_2)_yCOONH_4$$

(wherein x is 5 to 9, y is 0 to 2)
More specific examples are $C_5F_{11}COONH_4$, $C_6F_{13}COONH_4$, $C_7F_{15}COONH_4$, $C_8F_{17}COONH_4$, $C_9F_{19}COONH_4$, $H(CF_2)_5COONH_4$, $H(CF_2)_6COONH_4$, $H(CF_2)_7COONH_4$, $H(CF_2)_8COONH_4$ and $H(CF_2)_9COONH_4$.

Examples of surfactants of the formula (2) for use in the invention are compounds represented by $$C_pF_{2p-1}O(CH_2CH_2O)_qH$$

$$C_pF_{2p-1}O(CH_2CH_2O)_qC_rH_{2r+1}$$

$$C_pF_{2p+1}O(CH_2CH_2O)_qH$$

$$C_pF_{2p+1}O(CH_2CH_2O)_qC_rH_{2r+1}$$

(wherein p is 5 to 15, q is 5 to 20, r is 1 to 4)
More specific examples are $C_6F_{11}O(CH_2CH_2O)_qCH_3$, $C_9F_{17}O(CH_2CH_2O)_qCH_3$, $C_6F_{13}O(CH_2CH_2O)_qH$, $C_6F_{13}O(CH_2CH_2O)_qCH_3$, $C_9F_{19}O(CH_2CH_2O)_qCH_3$ and $C_9F_{19}O(CH_2CH_2O)_qH$. The value q is 17 on the average.

Examples of surfactants of the formula (3) for use in the invention are compounds represented by $$C_pF_{2p-1}(CH_2CH_2O)_qH$$

$$C_pF_{2p-1}(CH_2CH_2O)_qC_rH_{2r+1}$$

$$C_pF_{2p+1}(CH_2CH_2O)_qH$$

$$C_pF_{2p+1}(CH_2CH_2O)_qC_rH_{2r+1}$$

(wherein p is 5 to 15, q is 5 to 20, r is 1 to 4)
More specific examples are $C_6F_{11}(CH_2CH_2O)_qCH_3$, $C_9F_{17}(CH_2CH_2O)_qCH_3$, $C_6F_{13}(CH_2CH_2O)_qH$, $C_6F_{13}(CH_2CH_2O)_qCH_3$, $C_9F_{19}(CH_2CH_2O)_qCH_3$ and $C_9F_{19}(CH_2CH_2O)_qH$. The value q is 17 on the average.

According to the invention, the surfactant is used in a concentration of 50 to 1500 ppm, preferably 200 to 600 ppm, as present in the cleaning agent when the surfactant is a compound of the formula (1), or in a concentration of 50 to 100000 ppm, preferably 300 to 50000 ppm, as present in the cleaning agent when the surfactant is a compound of the formula (2) or (3). If the concentration is lower than the above range, the surfactant imparts the agent no effect to prevent the adhesion of fine particles, whereas if the above range is exceeded, the surfactant fails to produce an improved effect and tends to become rather insoluble. An insoluble portion of the surfactant then adheres to the surface of the wafer or the like.

According to the invention, the concentration of hydrofluoric acid in the cleaning agent is 0.1 to 4 wt. %, preferably 0.2 to 1.5 wt. %. If the concentration is lower, removal of the native oxide film requires a longer period of time, while when the concentration exceeds the above range, the agent tends to become no longer effective for preventing the adhesion of fine particles.

In the case where the cleaning agent embodying the invention is required to remove metallic pollutants from the silicon wafer surface, hydrogen peroxide can be added to the agent in addition to, or in place of, hydrofluoric acid. Hydrochloric acid, nitric acid, acetic acid, sulfuric acid or phosphoric acid is also usable besides the peroxide. The peroxide or acid is used, for example, in an amount preferably of about 1.0 to about 30 wt. % in the cleaning agent.

Among the compounds of the formula (1), $C_7F_{15}COONH_4$ is especially preferable for use in the invention. Preferred among the compounds of the formula (2) are $C_9F_{17}O(CH_2CH_2O)_mCH_3$ wherein m is 5 to 20, and is especially 17 on the average.

BEST MODE OF CARRYING OUR THE INVENTION

Examples and comparative examples are given below for a further description.

EXAMPLE 1

A native oxide film was removed from 4-inch silicon wafers with a 0.5% HF aqueous solution, followed by rinsing with ultrapure water. Five such silicon wafers were immersed for 10 minutes in a treating solution prepared by adding to a 0.5% HF aqueous solution fine particles of polystyrene latex about 0.6 μm in size and serving as standard fine particles in a quantity of $10^5$ particles/ml and further adding a specified amount of surfactant listed in Table 1 to the solution. The wafers were then rinsed with ultrapure water, dried and thereafter checked for the number of fine particles adhering to the wafer surface using a laser surface inspection device (LS-5000, product of Hitachi Electronics Engineering Co., Ltd.). Table 1 shows the average of the particle numbers thus determined. Table 1 also shows the result achieved with a comparative treating solution prepared by the same procedure as in the example.

TABLE 1

| Example 1 No. | surface active agent kind | concentration (ppm) | number of adhered particles |
|---|---|---|---|
| 1 | $C_6F_{13}COONH_4$ | 200 | 200 |
| 2 | $C_7F_{15}COONH_4$ | 50 | 400 |
| 3 | $C_7F_{15}COONH_4$ | 100 | 300 |
| 4 | $C_7F_{15}COONH_4$ | 200 | 150 |
| 5 | $C_7F_{15}COONH_4$ | 300 | 90 |
| 6 | $C_7F_{15}COONH_4$ | 600 | 120 |
| 7 | $C_7F_{15}COONH_4$ | 1000 | 200 |
| 8 | $C_7F_{15}COONH_4$ | 1500 | 250 |
| 9 | $C_7F_{15}COONH_4$ | 2000 | 280 |
| 10 | $C_7F_{15}COONH_4$ | 3000 | 200 |
| 11 | $C_8F_{17}COONH_4$ | 200 | 60 |
| comparison | none | — | at least 10000 |

COMPARATIVE EXAMPLE 1

The same procedure as in Example 1 was repeated with the exception of using the surfactants listed in Table 2 to check silicon wafers for the number of fine particles adhering to the surface of each wafer. Table 2 shows the results.

TABLE 2

| Com. Ex. 1 | surface active agent | | number of adhered |
|---|---|---|---|
| No. | kind | concentration (ppm) | particles |
| 1 | $C_6F_{13}COOH$ | 200 | 1650 |
| 2 | $C_7F_{15}COOH$ | 50 | 1400 |
| 3 | $C_7F_{15}COOH$ | 100 | 710 |
| 4 | $C_7F_{15}COOH$ | 200 | 580 |
| 5 | $C_7F_{15}COOH$ | 300 | 480 |
| 6 | $C_7F_{15}COOH$ | 600 | 510 |
| 7 | $C_7F_{15}COOH$ | 1000 | 500 |
| 8 | $C_7F_{15}COOH$ | 1500 | 510 |
| 9 | $C_7F_{15}COOH$ | 2000 | 570 |
| 10 | $C_7F_{15}COOH$ | 3000 | 530 |
| 11 | $C_8F_{17}COOH$ | 200 | 410 |
| 12 | $C_7H_{15}COOH$ | 300 | at least 10000 |
| 13 | $C_7H_{15}COOH$ | 600 | 8700 |

EXAMPLE 2

The same procedure as in Example 1 was repeated with the exception of using the surfactants and diluted hydrofluoric acid listed in Table 3 to check silicon wafers for the number of fine particles adhering to the surface of each wafer. Table 3 shows the results.

TABLE 3

| Example 2 | surface active agent | | concentration of dil-HF | number of adhered |
|---|---|---|---|---|
| No. | kind | concn. (ppm) | (wt. %) | particles |
| 1 | $C_7F_{15}COONH_4$ | 300 | 0.25 | 75 |
| 2 | $C_7F_{15}COONH_4$ | 300 | 0.50 | 90 |
| 3 | $C_7F_{15}COONH_4$ | 300 | 0.75 | 150 |
| 4 | $C_7F_{15}COONH_4$ | 300 | 1.50 | 280 |
| 5 | $C_7F_{15}COONH_4$ | 300 | 3.00 | 350 |

EXAMPLE 3

The same procedure as in Example 1 was repeated with the exception of using the surfactants (m is 17 on the average) listed in Table 4 to check silicon wafers for the number of fine particles adhering to the surface of each wafer. Table 4 shows the results.

TABLE 4

| Example | surface active agent | | number of adhered |
|---|---|---|---|
| No. | kind | concn. (ppm) | particles |
| 1 | $C_9F_{17}O(CH_2CH_2O)mCH_3$ | 50 | 950 |
| 2 | $C_9F_{17}O(CH_2CH_2O)mCH_3$ | 100 | 600 |
| 3 | $C_9F_{17}O(CH_2CH_2O)mCH_3$ | 200 | 390 |
| 4 | $C_9F_{17}O(CH_2CH_2O)mCH_3$ | 300 | 220 |
| 5 | $C_9F_{17}O(CH_2CH_2O)mCH_3$ | 600 | 170 |
| 6 | $C_9F_{17}O(CH_2CH_2O)mCH_3$ | 1000 | 150 |
| 7 | $C_9F_{17}O(CH_2CH_2O)mCH_3$ | 1500 | 150 |
| 8 | $C_9F_{17}O(CH_2CH_2O)mCH_3$ | 2000 | 160 |
| 9 | $C_9F_{17}O(CH_2CH_2O)mCH_3$ | 3000 | 150 |
| 10 | $C_9F_{17}O(CH_2CH_2O)mCH_3$ | 10000 | 140 |
| 11 | $C_9F_{17}O(CH_2CH_2O)mCH_3$ | 50000 | 140 |
| 12 | $C_9F_{17}O(CH_2CH_2O)mCH_3$ | 100000 | 150 |

INDUSTRIAL APPLICABILITY

The present invention provides an agent for cleaning the surfaces of silicon wafers and the like wherein a surfactant of specific structure is used in a specified composition so as to exhibit a remarkable effect in preventing the adhesion of fine particles, and a cleaning method.

We claim:

1. A cleaning agent consisting of 0.1 to 4 wt. % of hydrofluoric acid, a surfactant of the following formula (1) in a concentration of 50 to 1500 ppm or a surfactant of the following formula (2) or (3) in a concentration of 50 to 100000 ppm, and the balance water, $$RfCOONH_4 \quad (1)$$

wherein Rf is a fluorine-containing hydrocarbon group having 5 to 9 carbon atoms, $$RfO(CH_2CH_2O)nR \quad (2)$$

$$Rf(CH_2CH_2O)nR \quad (3)$$

wherein Rf is a fluorine-containing hydrocarbon group having 5 to 15 carbon atoms, R is hydrogen or alkyl having 1 to 4 carbon atoms, and n is 5 to 20.

2. A cleaning agent as defined in claim 1 wherein the concentration of the surfactant of the formula (1) is 200 to 600 ppm.

3. A cleaning agent as defined in claim 1 wherein the concentration of the surfactant of the formula (2) or (3) is 300 to 50000 ppm.

4. A cleaning agent as defined in claim 1 wherein the concentration of the hydrofluoric acid is 0.2 to 1.5 weight %.

5. A cleaning agent as defined in claim 1 wherein the surfactant of the formula (1) is $C_7F_{15}COONH_4$.

6. A cleaning agent as defined in claim 1 wherein the surfactant of the formula (2) is $C_9F_{17}O(CH_2CH_2O)mCH_3$ (m is 5 to 20).

7. A cleaning agent as defined in claim 1 wherein the surfactant of the formula (3) is $C_9F_{17}(CH_2CH_2O)nCH_3$ (n is 5 to 20).

8. A cleaning agent consisting of at least one compound selected from the group consisting of hydrogen peroxide, hydrochloric acid, nitric acid, acetic acid, sulfuric acid and phosphoric acid in addition to, or in place of, hydrofluoric acid of claim 1.

9. A method of cleaning a silicon wafer surface wherein the cleaning agent is a cleaning solution of claim 1.

10. A method of cleaning a silicon wafer surface wherein the cleaning agent is a cleaning solution of claim 2.

11. A method of cleaning a silicon wafer surface wherein the cleaning agent is a cleaning solution of claim 3.

12. A method of cleaning a silicon wafer surface wherein the cleaning agent is a cleaning solution of claim 4.

13. A method of cleaning a silicon wafer surface wherein the cleaning agent is a cleaning solution of claim 5.

14. A method of cleaning a silicon wafer surface wherein the cleaning agent is a cleaning solution of claim 6.

15. A method of cleaning a silicon wafer surface wherein the cleaning agent is a cleaning solution of claim 7.

16. A method of cleaning a silicon wafer surface wherein the cleaning agent is a cleaning solution of claim 8.

* * * * *